(12) United States Patent
Brockman et al.

(10) Patent No.: US 11,437,567 B2
(45) Date of Patent: Sep. 6, 2022

(54) PERPENDICULAR SPIN TRANSFER TORQUE MAGNETIC MECHANISM

(71) Applicant: Intel Corporation, Santa Clara, CA (US)

(72) Inventors: Justin Brockman, Portland, OR (US); Christopher Wiegand, Portland, OR (US); MD Tofizur Rahman, Portland, OR (US); Daniel Ouelette, Portland, OR (US); Angeline Smith, Hillsboro, OR (US); Juan Alzate Vinasco, Portland, OR (US); Charles Kuo, Hillsboro, OR (US); Mark Doczy, Portland, OR (US); Kaan Oguz, Beaverton, OR (US); Kevin O'Brien, Portland, OR (US); Brian Doyle, Portland, OR (US); Oleg Golonzka, Beaverton, OR (US); Tahir Ghani, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/348,364

(22) PCT Filed: Dec. 28, 2016

(86) PCT No.: PCT/US2016/068904
§ 371 (c)(1),
(2) Date: May 8, 2019

(87) PCT Pub. No.: WO2018/125085
PCT Pub. Date: Jul. 5, 2018

(65) Prior Publication Data
US 2019/0280188 A1    Sep. 12, 2019

(51) Int. Cl.
*H01L 43/02* (2006.01)
*G11C 11/16* (2006.01)
(Continued)

(52) U.S. Cl.
CPC ............ *H01L 43/02* (2013.01); *G11C 11/161* (2013.01); *H01F 10/329* (2013.01);
(Continued)

(58) Field of Classification Search
CPC ........... H01L 27/222–228; H01L 43/08; H01L 43/10; G11C 11/161
See application file for complete search history.

(56) References Cited

U.S. PATENT DOCUMENTS 8,169,817 B2 * 5/2012 Nakayama ............... G11C 7/04
365/158
9,425,387 B1 8/2016 Liu et al.
(Continued)

OTHER PUBLICATIONS

International Search Report and Written Opinion for International Patent Application No. PCT/US2016/068904 dated Sep. 18, 2017, 11 pgs.
(Continued)

*Primary Examiner* — Stephen M Bradley
(74) *Attorney, Agent, or Firm* — Schwabe, Williamson & Wyatt P.C.

(57) ABSTRACT

An apparatus comprises a magnetic tunnel junction (MTJ) including a free magnetic layer, a fixed magnetic layer, and a tunnel barrier between the free and fixed layers, the tunnel barrier directly contacting a first side of the free layer, a capping layer contacting the second side of the free magnetic layer and boron absorption layer positioned a fixed distance above the capping layer.

19 Claims, 3 Drawing Sheets

300

| BAL | 310 |
|---|---|
| BCL | 315 |
| MgO | 320 |
| CoFeB (Free) | 325 |
| MgO | 326 |
| CoFeB (Fixed) | 327 |

(51) Int. Cl.
  *H01F 10/32* (2006.01)
  *H01F 41/30* (2006.01)
  *H01L 43/12* (2006.01)
  *H01L 43/08* (2006.01)
  *H01L 27/22* (2006.01)
  *H01L 43/10* (2006.01)

(52) U.S. Cl.
  CPC ....... *H01F 10/3286* (2013.01); *H01F 41/302* (2013.01); *H01L 43/08* (2013.01); *H01L 43/12* (2013.01); *H01L 27/228* (2013.01); *H01L 43/10* (2013.01)

(56) References Cited

U.S. PATENT DOCUMENTS

| | | | | |
|---|---|---|---|---|
| 9,831,421 | B2* | 11/2017 | Wang | H01F 10/3286 |
| 2012/0061781 | A1 | 3/2012 | Ohmori et al. | |
| 2012/0063218 | A1* | 3/2012 | Huai | H01F 10/3286 |
| | | | | 365/171 |
| 2012/0280339 | A1* | 11/2012 | Zhang | G11C 11/16 |
| | | | | 257/421 |
| 2012/0292723 | A1* | 11/2012 | Luo | H01L 43/08 |
| | | | | 257/421 |
| 2013/0270523 | A1 | 10/2013 | Wang et al. | |
| 2014/0042571 | A1 | 2/2014 | Gan et al. | |
| 2014/0154529 | A1 | 6/2014 | Yang et al. | |
| 2016/0035970 | A1 | 2/2016 | Tang et al. | |
| 2016/0133829 | A1 | 5/2016 | Kuo | |
| 2016/0163971 | A1* | 6/2016 | Jeong | G11C 11/161 |
| | | | | 438/3 |
| 2016/0218278 | A1 | 7/2016 | Pinarbasi et al. | |
| 2016/0284763 | A1 | 9/2016 | Tahmasebi | |
| 2016/0315249 | A1* | 10/2016 | Kardasz | G11C 11/161 |
| 2016/0315250 | A1* | 10/2016 | Guo | G11C 11/161 |
| 2018/0006215 | A1* | 1/2018 | Jeong | H01L 43/12 |

OTHER PUBLICATIONS

International Search Report and Written Opinion for International Patent Application No. PCT/US2016/068904, dated Jul. 11, 2019, 8 pages.

Search Report from European Patent Application No. 16925528.8, dated Jun. 8, 2020, 12 pages.

* cited by examiner

PERPENDICULAR SPIN TRANSFER TORQUE MAGNETIC MECHANISM

CROSS-REFERENCE TO RELATED APPLICATION

This patent application is a U.S. National Phase Application under 35 U.S.C. § 371 of International Application No. PCT/US2016/068904, filed Dec. 28, 2016, entitled "PERPENDICULAR SPIN TRANSFER TORQUE MAGNETIC MECHANISM," which designates the United States of America, the entire disclosure of which is hereby incorporated by reference in its entirety and for all purposes.

FIELD

The present disclosure generally relates to semiconductor devices, and in particular, spintronic memory devices.

BACKGROUND

Some magnetic memories, such as a perpendicular spin transfer torque memory (pSTTM), utilize a magnetic tunnel junction (MTJ) for switching and detection of the memory's magnetic state. In such devices, the memory is read by assessing a change of resistance (e.g., tunneling magnetoresistance (TMR)) for different relative magnetizations of ferromagnetic layers in the MTJ.

pSTTM devices may also include magnesium oxide (MgO)/Cobalt-Iron-Boron (CoFeB)/MgO free layers. Boron flow out of pSTTM devices having conventional MgO/CoFeB-based/MgO free layers is critical for obtaining good free layer crystallinity, high tunneling magnetoresistance (TMR), and high spin polarization. However, the use of a boron absorption layer (e.g., tantalum (Ta)) above the free layer also causes chemical and physical damage to the MgO and CoFeB layers, which results in degrading perpendicular anisotropy.

DETAILED DESCRIPTION

In the following description, numerous specific details are set forth in order to provide a thorough understanding of various embodiments. However, various embodiments of the invention may be practiced without the specific details. In other instances, well-known methods, procedures, components, and circuits have not been described in detail so as not to obscure the particular embodiments of the invention.

A MTJ configuration is disclosed in which a remote boron absorption layer is formed a fixed distance above a capping layer to provide high tunneling magnetoresistance (TMR) and spin polarization without causing chemical and physical damage to the capping layer and free layer which results in degrading perpendicular anisotropy. In a further embodiment, a boron conducting layer is placed between the boron absorption layer and the capping layer to provide the fixed distance.

Figures 1, 3:
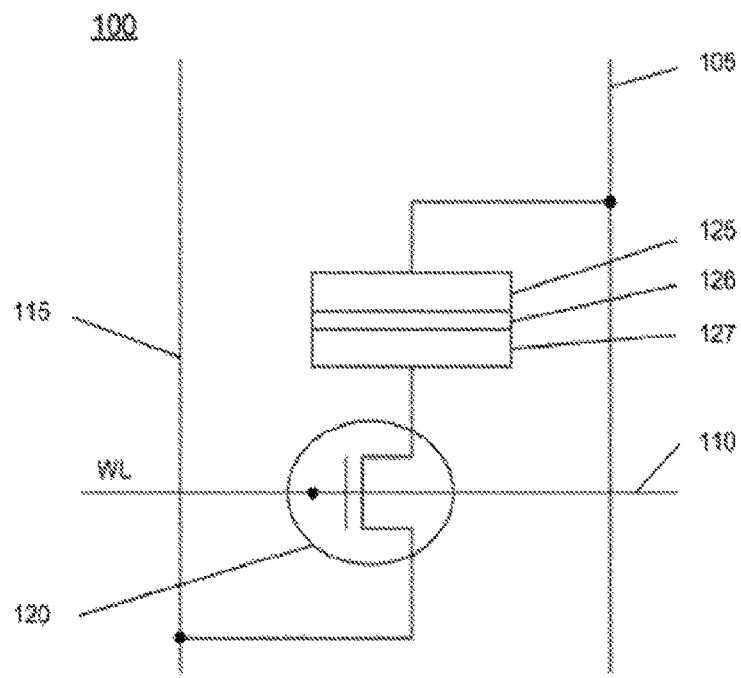
FIG. 1 illustrates one embodiment of a memory cell.
FIG. 3 illustrates one embodiment of a MTJ having a remote boron absorption layer.

FIG. 1 illustrates one embodiment of a memory cell 100. In one embodiment, memory cell 100 includes a MTJ consisting of ferromagnetic (FM) layers 125, 127 and tunneling barrier 126 (e.g., MgO). The MTJ couples bit line (BL) 105 to selection switch 120 (e.g., transistor), word line (WL) 110, and sense line (SL) 115. Memory 100 is "read" by assessing the change of resistance (e.g., TMR) for different relative magnetizations of FM layers 125, 127. More specifically, the relative magnetization directions of layers 125 and 127 determine MTJ resistance.

When the magnetization directions between the two layers are anti-parallel, the MTJ is in a high resistance state. When the magnetization directions between the two layers are parallel, the MTJ is in a low resistance state. Layer 127 is the "reference layer" or "fixed layer" because its magnetization direction is fixed. Layer 125 is the "free layer" because its magnetization direction is changed by passing a driving current polarized by the reference layer (e.g., a positive voltage applied to layer 127 rotates the magnetization direction of layer 125 opposite to that of layer 127 and negative voltage applied to layer 127 rotates the magnetization direction of layer 125 to the same direction of layer 127).

As discussed above, a Ta boron absorption layer is often placed over the MTJ. Placing the boron absorption layer very close to the free layer and an MgO cap damages the MgO cap through sputter implant and/or chemical scavenging of oxygen. Such a configuration provides a high TMR, but significantly degrades the retention characteristics of the device by damaging the MgO capping layer, which is a key source of magnetic perpendicularity.

Figure 2A:
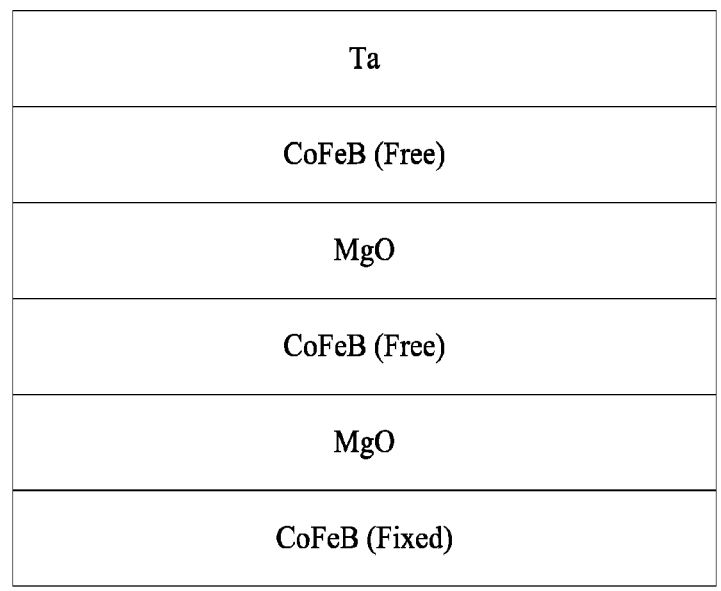
FIGS. 2A & 2B illustrate conventional MTJs in a pSTTM device.

Another conventional MTJ configuration features separating the boron absorption layer from the MgO cap using a simple, thin layer of OA-10A of CoFeB. FIG. 2A illustrates such a configuration. As shown in FIG. 2A, a second CoFeB free layer is included to separate the boron absorption layer from the MgO cap. However, this thin CoFeB layer is not adequate to protect the MgO cap from damage. Moreover, the CoFeB layer cannot be made thicker using any straightforward approach because its magnetic properties would negatively influence the free layer.

Figure 2B:
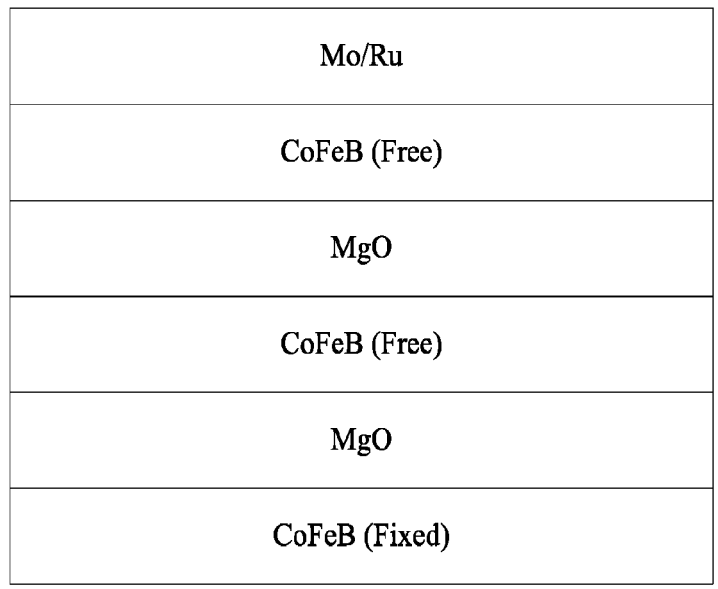

FIG. 2B illustrates yet another MTJ configuration in which the boron absorption layer is replaced with an inert material, such as molybdenum (Mo) or ruthenium (Ru). Further, the boron-absorbing layer may be placed a significant distance from the free layer that it can no longer adequately function to absorb any boron. For example, it is common to have a Ta-based hard mask. These configurations provide a damage-free MgO cap. However, a tradeoff is a cost of a poorly-crystallized free layer with low TMR.

According to one embodiment, a configuration is disclosed in which a remote boron absorption layer is formed a fixed above an MgO capping layer. In such an embodiment, a boron conducting layer is placed between the boron absorption layer and the MgO capping layer. FIG. 3 illustrates one embodiment of a MTJ 300 having a remote boron absorption layer. As shown in FIG. 3, MTJ 300 includes tunneling barrier 326 between fixed layer 327 and free layer 325, respectively. Additionally, MTJ 300 includes second oxidized MgO interface 320 (or MgO capping layer) that contacts the free layer 325.

Moreover, a remote boron absorption layer (BAL) 310 is included in MTJ 300. In such an embodiment, BAL 310 is positioned a fixed distance (e.g., between 10 Å-50 Å) above capping layer 320. This distance safely protects the free layer 325 and MgO layers from the chemical and physical damage caused by the reactive BAL 310. According to one embodiment, materials for BAL 310 may include Ta, hafnium (Hf) and titanium (Ti).

In a further embodiment, a boron conduction layer (BCL) 315 is included to separate the BAL 310 from the capping layer 320 to maintain good boron flow from the free layer 325 to the BAL 315. The magnetic properties of the BCL 315 may be magnetic or non-magnetic depending on the impurity doping concentration. In magnetic embodiments, BCL 315 may be an in-plane magnet to promote extra spin-torque on the free layer 325. However in other magnetic embodiments, BCL 315 may be a perpendicular magnet to provide additional device stability and improve retention characteristics through stray field coupling between free layer 325 magnetic and BCL 315 magnet.

Materials for BCL 315 may include cobalt (Co), iron (Fe), ruthenium (Ru), carbon (C), cobalt tantalum (CoTa), cobalt tungsten (CoW), cobalt molybdenum (CoMo), cobalt hafnium (CoHf), colbalt ruthenium (CoRu), iron tantalum (FeTa), iron tungsten (FeW), iron molybdenum (FeMo), iron hafnium (FeHf), and iron ruthenium (FeRu).

Materials for BCL 315 may also include cobalt iron tantalum (CoFeTa), cobalt iron tungsten (CoFeW), cobalt iron molybdenum (CoFeMo), cobalt iron hafnium (CoFeHf), cobalt iron ruthenium (CoFeRu), cobalt boron tantalum (CoBTa), cobalt boron tungsten (CoBW), cobalt boron molybdenum (CoBMo), cobalt boron hafnium (CoBHf), cobalt boron ruthenium (CoBRu), iron boron tantalum (FeBTa), iron boron FeBW, iron boron molybdenum (FeBMo), iron boron hafnium (FeBHf), iron boron ruthenium (FeBRu), cobalt iron boran tantalum (CoFeBTa), cobalt iron boran tungsten (CoFeBW), cobalt iron boran molybdenum (CoFebMo), cobalt iron boran hafnium (CoFeBHf) and cobalt iron boran ruthenium (CoFeBRu).

The above-described MTJ features a remote boron absorption layer formed a fixed distance above a capping layer and a boron conducting layer placed between the boron absorption layer and the capping layer to maintain the fixed distance. Thus, the MTJ simultaneously provides high TMR and high perpendicular magnetic anisotropy, without the need to compromise one for the other.

Figure 4:
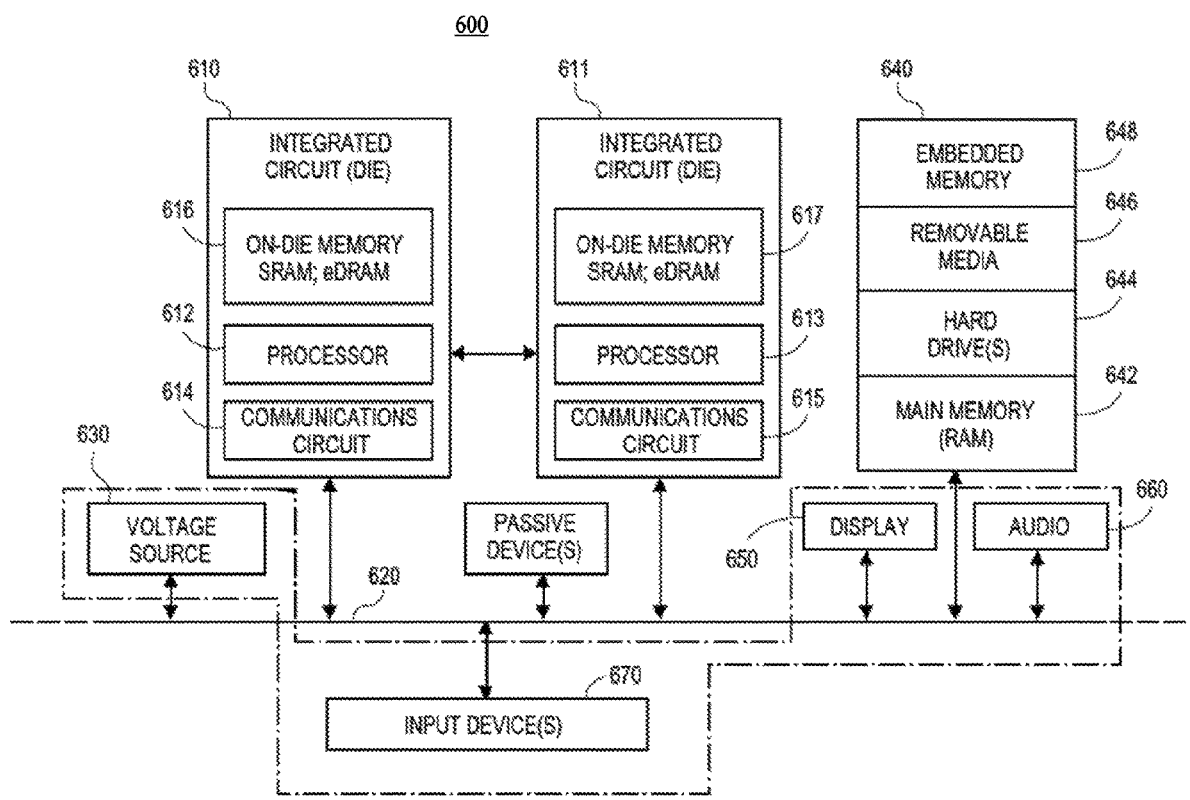
FIG. 4 illustrates a system in which a pSTTM devices may be implemented.

FIG. 4 illustrates one embodiment of a computer system 600 in which a pSTTM device may be implemented. The computer system 600 (also referred to as the electronic system 600) as depicted can embody a semiconductor die packaged with one or more ACIs having metal-density layer units of fractal geometry according to any of the several disclosed embodiments and their equivalents as set forth in this disclosure. The computer system 600 may be a mobile device such as a netbook computer. The computer system 600 may be a mobile device such as a wireless smart phone. The computer system 600 may be a desktop computer. The computer system 600 may be a hand-held reader. The computer system 600 may be a server system. The computer system 600 may be a supercomputer or high-performance computing system.

In an embodiment, the electronic system 600 is a computer system that includes a system bus 620 to electrically couple the various components of the electronic system 600. The system bus 620 is a single bus or any combination of busses according to various embodiments. The electronic system 600 includes a voltage source 630 that provides power to the integrated circuit 610. In some embodiments, the voltage source 630 supplies current to the integrated circuit 610 through the system bus 620.

The integrated circuit 610 is electrically coupled to the system bus 620 and includes any circuit, or combination of circuits according to an embodiment. In an embodiment, the integrated circuit 610 includes a processor 612 that can be of any type. As used herein, the processor 612 may mean any type of circuit such as, but not limited to, a microprocessor, a microcontroller, a graphics processor, a digital signal processor, or another processor. In an embodiment, the processor 612 includes a semiconductor die packaged with one or more ACIs having metal-density layer units of fractal geometry, as disclosed herein. In an embodiment, SRAM embodiments are found in memory caches of the processor. Other types of circuits that can be included in the integrated circuit 610 are a custom circuit or an application-specific integrated circuit (ASIC), such as a communications circuit 614 for use in wireless devices such as cellular telephones, smart phones, pagers, portable computers, two-way radios, and similar electronic systems, or a communications circuit for servers. In an embodiment, the integrated circuit 610 includes on-die memory 616 such as static random-access memory (SRAM). In an embodiment, the integrated circuit 610 includes embedded on-die memory 616 such as embedded dynamic random-access memory (eDRAM).

In an embodiment, the integrated circuit 610 is complemented with a subsequent integrated circuit 611. Useful embodiments include a dual processor 613 and a dual communications circuit 615 and dual on-die memory 617 such as SRAM. In an embodiment, the dual integrated circuit 610 includes embedded on-die memory 617 such as eDRAM.

In an embodiment, the electronic system 600 also includes an external memory 640 that in turn may include one or more memory elements suitable to the particular application, such as a main memory 642 in the form of RAM, one or more hard drives 644, and/or one or more drives that handle removable media 646, such as diskettes, compact disks (CDs), digital variable disks (DVDs), flash memory drives, and other removable media known in the art. The external memory 640 may also be embedded memory 648 such as the first die in an embedded TSV die stack, according to an embodiment.

In an embodiment, the electronic system 600 also includes a display device 650, an audio output 660. In an embodiment, the electronic system 600 includes an input device such as a controller 670 that may be a keyboard, mouse, trackball, game controller, microphone, voice-recognition device, or any other input device that inputs information into the electronic system 600. In an embodiment, an input device 670 is a camera. In an embodiment, an input device 670 is a digital sound recorder. In an embodiment, an input device 670 is a camera and a digital sound recorder.

As shown herein, the integrated circuit 610 can be implemented in a number of different embodiments, including a semiconductor die packaged with one or more ACIs having metal-density layer units of fractal geometry according to any of the several disclosed embodiments and their equivalents, an electronic system, a computer system, one or more methods of fabricating an integrated circuit, and one or more methods of fabricating an electronic assembly that includes a semiconductor die packaged with one or more ACIs having metal-density layer units of fractal geometry according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed semiconductor die packaged with one or more ACIs having metal-density layer units of fractal geometry embodiments and their equivalents. A foundation substrate may be included, as represented by the dashed line of FIG. 4. Passive devices may also be included, as is also depicted in FIG. 4.

References to "one embodiment", "an embodiment", "example embodiment", "various embodiments", etc., indicate that the embodiment(s) so described may include particular features, structures, or characteristics, but not every embodiment necessarily includes the particular features, structures, or characteristics. Further, some embodiments may have some, all, or none of the features described for other embodiments.

In the following description and claims, the term "coupled" along with its derivatives, may be used. "Coupled" is used to indicate that two or more elements co-operate or interact with each other, but they may or may not have intervening physical or electrical components between them.

As used in the claims, unless otherwise specified the use of the ordinal adjectives "first", "second", "third", etc., to describe a common element, merely indicate that different instances of like elements are being referred to, and are not intended to imply that the elements so described must be in a given sequence, either temporally, spatially, in ranking, or in any other manner.

The following clauses and/or examples pertain to further embodiments or examples. Specifics in the examples may be used anywhere in one or more embodiments. The various features of the different embodiments or examples may be variously combined with some features included and others excluded to suit a variety of different applications. Examples may include subject matter such as a method, means for performing acts of the method, at least one machine-readable medium including instructions that, when performed by a machine cause the machine to performs acts of the method, or of an apparatus or system for facilitating hybrid communication according to embodiments and examples described herein.

Some embodiments pertain to Example 1 that includes an apparatus comprising a magnetic tunnel junction (MTJ) including a free magnetic layer, a fixed magnetic layer, and a tunnel barrier between the free and fixed layers, the tunnel barrier directly contacting a first side of the free layer, a capping layer contacting a second side of the free magnetic layer and a boron absorption layer positioned a fixed distance above the capping layer.

Example 2 includes the subject matter of Example 1, further comprising a boron conduction layer positioned to separate the boron absorption layer and the capping layer.

Example 3 includes the subject matter of Examples 1 and 2, wherein the boron conduction layer maintains a boron flow from the free magnetic layer to the boron absorption layer.

Example 4 includes the subject matter of Examples 1-3, wherein the fixed distance between the boron absorption layer and the capping layer is between 10 Å-50 Å.

Example 5 includes the subject matter of Examples 1-4, wherein the BCL is non-magnetic.

Example 6 includes the subject matter of Examples 1-5, wherein the BCL is magnetic.

Example 7 includes the subject matter of Examples 1-6, wherein the BCL is an in-plane magnet.

Example 8 includes the subject matter of Examples 1-7, wherein the BCL is a perpendicular magnet.

Example 9 includes the subject matter of Examples 1-8, wherein the BAL is comprised of a material including at least one of: tantalum (Ta), hafnium (Hf) and titanium (Ti).

Example 10 includes the subject matter of Examples 1-9, wherein the BCL is comprised of a material including at least one of: cobalt (Co), iron (Fe), ruthenium (Ru), carbon (C), cobalt tantalum (CoTa), cobalt tungsten (CoW), cobalt molybdenum (CoMo), cobalt hafnium (CoHf), colbalt ruthenium (CoRu), iron tantalum (FeTa), iron tungsten (FeW), iron molybdenum (FeMo), iron hafnium (FeHf), iron ruthenium (FeRu), cobalt iron tantalum (CoFeTa), cobalt iron tungsten (CoFeW), cobalt iron molybdenum (CoFeMo), cobalt iron hafnium (CoFeHf), cobalt iron ruthenium (CoFeRu), cobalt boron tantalum (CoBTa), cobalt boron tungsten (CoBW), cobalt boron molybdenum (CoBMo), cobalt boron hafnium (CoBHf), cobalt boron ruthenium (CoBRu), iron boron tantalum (FeBTa), iron boron FeBW, iron boron molybdenum (FeBMo), iron boron hafnium (FeBHf), iron boron ruthenium (FeBRu), cobalt iron boron tantalum (CoFeBTa), cobalt iron boron tungsten (CoFeBW), cobalt iron boron molybdenum (CoFebMo), cobalt iron boron hafnium (CoFeBHf) and cobalt iron boron ruthenium (CoFeBRu).

Some embodiments pertain to Example 11 that includes a method comprising fabricating an acoustic resonator structure, including forming a magnetic tunnel junction (MTJ) including a free magnetic layer, a fixed magnetic layer, and a tunnel barrier between the free and fixed layers, the tunnel barrier directly contacting a first side of the free layer, forming a capping layer over a second side of the free magnetic layer and forming a boron absorption layer a fixed distance above the capping layer.

Example 12 includes the subject matter of Example 11, further comprising forming a boron conduction layer to between the boron absorption layer and the capping layer.

Example 13 includes the subject matter of Examples 11 and 12, wherein the fixed distance between the boron absorption layer and the capping layer is between 10 Å-50 Å.

Example 14 includes the subject matter of Examples 11-13, wherein the BCL is non-magnetic.

Example 15 includes the subject matter of Examples 11-14, wherein the BCL is magnetic.

Example 16 includes the subject matter of Examples 11-15, wherein the BCL is an in-plane magnet.

Example 17 includes the subject matter of Examples 11-16, wherein the BCL is a perpendicular magnet.

Some embodiments pertain to Example 18 that includes a perpendicular spin transfer torque memory (pSTTM) comprising a magnetic tunnel junction (MTJ) including a free magnetic layer, a fixed magnetic layer and a tunnel barrier between the free and fixed layers, the tunnel barrier contacting a first side of the free layer, a capping layer contacting a second side of the free magnetic layer and a boron absorption layer positioned a fixed distance above the capping layer.

Example 19 includes the subject matter of Example 18, further comprising a boron conduction layer positioned to separate the boron absorption layer and the capping layer.

Example 20 includes the subject matter of Examples 18 and 19, wherein the fixed distance between the boron absorption layer and the capping layer is between 10 Å-50 Å.

Example 21 includes the subject matter of Examples 18-20, wherein the BCL is non-magnetic.

Example 22 includes the subject matter of Examples 18-21, wherein the BCL is magnetic.

Example 23 includes the subject matter of Examples 18-22, wherein the BCL is an in-plane magnet.

Example 24 includes the subject matter of Examples 18-23, wherein the BCL is a perpendicular magnet.

Although embodiments of the invention have been described in language specific to structural features and/or methodological acts, it is to be understood that claimed subject matter may not be limited to the specific features or acts described. Rather, the specific features and acts are disclosed as sample forms of implementing the claimed subject matter.

What is claimed is:

1. An apparatus comprising:
   a magnetic tunnel junction (MTJ) including:
   a free magnetic layer;
   a fixed magnetic layer; and
   a tunnel barrier between the free and fixed layers, the tunnel barrier directly contacting a first side of the free layer;
   a capping layer directly contacting a second side of the free magnetic layer, wherein the capping layer and the tunnel barrier have a same composition;
   a boron absorption layer (BAL) positioned a fixed distance above the capping layer, wherein the BAL is comprised of molybdenum (Mo); and
   a boron conduction layer (BCL) positioned between the BAL and the capping layer, the BCL to separate the BAL and the capping layer by the fixed distance, wherein the BCL comprises a material including hafnium.

2. The apparatus of claim 1, wherein the boron conduction layer (BCL) maintains a boron flow from the free magnetic layer to the boron absorption layer.

3. The apparatus of claim 2, wherein the fixed distance between the boron absorption layer and the capping layer is between 10 Å-50 Å.

4. The apparatus of claim 2, wherein the BCL is non-magnetic.

5. The apparatus of claim 2, wherein the BCL is magnetic.

6. The apparatus of claim 5, wherein the BCL is an in-plane magnet.

7. The apparatus of claim 6, wherein the BCL is a perpendicular magnet.

8. A method comprising fabricating an acoustic resonator structure, including:
   forming a magnetic tunnel junction (MTJ) including a free magnetic layer, a fixed magnetic layer, and a tunnel barrier between the free and fixed layers, the tunnel barrier directly contacting a first side of the free layer;
   forming a capping layer directly contacting a second side of the free magnetic layer, wherein the capping layer and the tunnel barrier have a same composition;
   forming a boron conduction layer (BCL) on the capping layer, wherein the BCL comprises a material including hafnium; and
   forming a boron absorption layer (BAL) a fixed distance above the capping layer, wherein the BAL is comprised of molybdenum (Mo), and wherein the BCL is positioned to separate the BAL and the capping layer by the fixed distance.

9. The method of claim 8, wherein the fixed distance between the boron absorption layer and the capping layer is between 10 Å-50 Å.

10. The method of claim 8, wherein the BCL is non-magnetic.

11. The method of claim 8, wherein the BCL is magnetic.

12. The method of claim 11, wherein the BCL is an in-plane magnet.

13. The method of claim 12, wherein the BCL is a perpendicular magnet.

14. A perpendicular spin transfer torque memory (pSTTM) comprising:
   a magnetic tunnel junction (MTJ) including:
   a free magnetic layer;
   a fixed magnetic layer; and
   a tunnel barrier between the free and fixed layers, the tunnel barrier directly contacting a first side of the free layer;
   a capping layer directly contacting a second side of the free magnetic layer, wherein the capping layer and the tunnel barrier have a same composition;
   a boron absorption layer (BAL) positioned a fixed distance above the capping layer, wherein the BAL is comprised of molybdenum (Mo); and
   a boron conduction layer (BCL) positioned between the BAL and the capping layer, the BCL to separate the BAL and the capping layer by the fixed distance, wherein the BCL comprises a material including hafnium.

15. The memory of claim 14, wherein the fixed distance between the boron absorption layer and the capping layer is between 10 Å-50 Å.

16. The memory of claim 14, wherein the BCL is non-magnetic.

17. The memory of claim 14, wherein the BCL is magnetic.

18. The memory of claim 17, wherein the BCL is an in-plane magnet.

19. The memory of claim 18, wherein the BCL is a perpendicular magnet.

* * * * *